US005142586A

United States Patent [19]

Berkhout

[11] Patent Number: 5,142,586

[45] Date of Patent: Aug. 25, 1992

[54] ELECTRO-ACOUSTICAL SYSTEM

[75] Inventor: Augustinus J. Berkhout, AW Wassenaar, Netherlands

[73] Assignee: Birch Wood Acoustics Nederland B.V., Rotterdam, Netherlands

[21] Appl. No.: 455,434

[22] PCT Filed: Mar. 29, 1989

[86] PCT No.: PCT/NL89/00013

§ 371 Date: Nov. 20, 1989

§ 102(e) Date: Nov. 20, 1989

[87] PCT Pub. No.: WO89/09465

PCT Pub. Date: Oct. 5, 1989

[30] Foreign Application Priority Data

Mar. 24, 1988 [NL] Netherlands ........................ 8800745

[51] Int. Cl.[5] ........................ H03G 3/00

[52] U.S. Cl. ........................ 381/63

[58] Field of Search ................ 381/1, 63; 84/630, 707

[56] References Cited

U.S. PATENT DOCUMENTS 4,105,864 8/1978 Berkovitz .

FOREIGN PATENT DOCUMENTS 0075615 4/1983 European Pat. Off. .

OTHER PUBLICATIONS

M. R. Schroeder, "Natural Sounding Artificial Reverberations", Jul. '62, Jour. Audio Eng. Soc., vol. 10.

A. J. Berkhout, "A New Direction in Electro-Acoustic Reverb. Control", Mar. '87, Audio Eng. Soc. Preprint 2441.

A. J. Berkhout, "A Holographic Approach to Acoustic Control", Dec. '88, pp. 977–995, Jour. Audio Eng. Soc., vol. 36, No. 12.

A. J. Berkhout, "*Applied Seismic Wave Theory*", 1987, Elsevier Science Publishing Co., Inc., N.Y., pp. XI–XIV, 20–23 (Green's theorem), 231–233, 240 (Chapter 8), and 301–303 (Chapter 10).

*Primary Examiner*—Forester W. Isen

*Attorney, Agent, or Firm*—Frishauf, Holtz, Goodman & Woodward

[57] ABSTRACT

A method and acoustical system for processing sound signals according to the principles of the acoustic holography of sound wave field extrapolation.

7 Claims, 9 Drawing Sheets

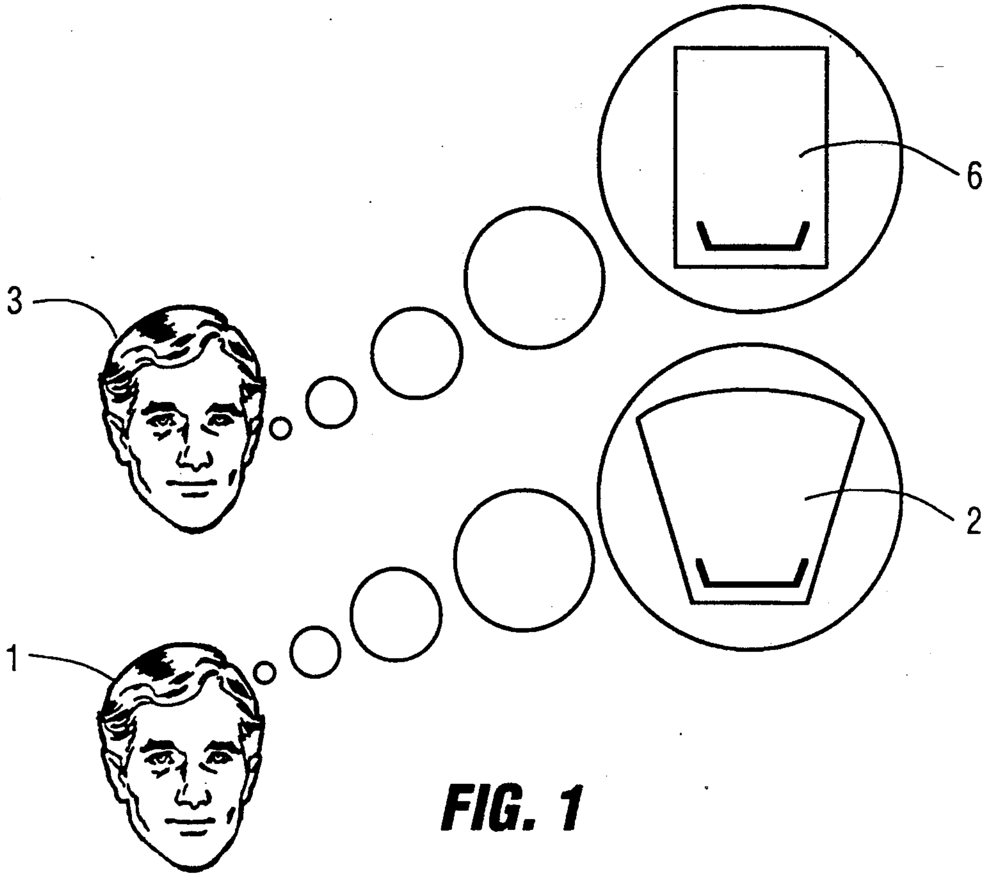
FIG. 1
FIG. 2
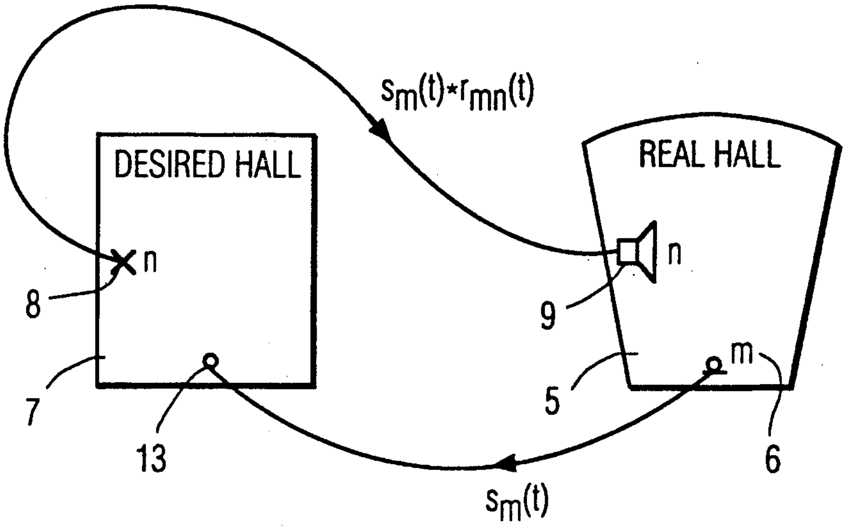

ELECTRO-ACOUSTICAL SYSTEM

The invention relates to a a method and electro-acoustical system for processing the sound emitted by one or more sound sources in a listening room, by recording said sound by means of a number of microphones, the signals (S) of which are processed in a processor according to the matrix relation $\vec{P}=T\vec{S}$, in which (P) represents the processed signals supplied from the processor to a number of loudspeakers distributed across the listening room, and wherein T represents the following transfer matrix:

$$T=\begin{pmatrix} T_{11} & T_{12} & \cdots & T_{1M} \\ T_{21} & T_{22} & \cdots & T_{2M} \\ \cdot & \cdot & & \cdot \\ \cdot & \cdot & & \cdot \\ \cdot & \cdot & & \cdot \\ T_{N1} & T_{N2} & \cdots & T_{NM} \end{pmatrix}$$

wherein M and N represent the number of microphone signals and loudspeaker signals respectively. Such a method is known from a preprint of a lecture before the Audio Engineering Society on the 82nd convention, Mar. 10-13, 1988 in London.

This preprint introduces a generalized description of electro-acoustical systems designed to improve the reproduction of sound in a room or, in other terms, to change or improve the acoustic conditions in a listening room. This description is based on the consideration that each linear transfer, whereby sound is picked up by microphones (S) and, after being processed, is emitted by loudspeakers (P), can be represented by the above matrix relation $\vec{P}=T\vec{S}$.

Dependent on the location of the microphones $\vec{S}$ represents direct sound, reflected sound, or both.

Dependent on the purpose of the electro-acoustical system $\vec{P}$ represents direct sound, reflected sound, or both.

The working of an electro-acoustical system is determined by the selection of the elements in the transfer matrix T. The above preprint does not teach how to make such selection.

A complete development of the relation $\vec{P}=T\vec{S}$ results in:

$$\begin{bmatrix} P_1 \\ P_2 \\ \cdot \\ \cdot \\ \cdot \\ P_N \end{bmatrix} = \begin{bmatrix} T_{11} & T_{12} & \cdots & T_{1M} \\ T_{21} & T_{22} & \cdots & T_{2M} \\ \cdot & \cdot & & \cdot \\ \cdot & \cdot & & \cdot \\ \cdot & \cdot & & \cdot \\ T_{N1} & T_{N2} & \cdots & T_{NM} \end{bmatrix} \begin{bmatrix} S_1 \\ S_2 \\ \cdot \\ \cdot \\ \cdot \\ S_M \end{bmatrix}$$

wherein $S_1, S_2 \ldots S_M$ define the microphone signals, which represent the direct sound or the reverberant sound or both and $P_1, P_2 \ldots P_N$ define the loudspeaker signals which reproduce the desired output sound. It is to be noted that a number of microphone signals may be equal due to the fact that they are emitted by the same microphone. Similarly a number of loudspeaker signals may be supplied to the same loudspeaker. The properties of the system are defined by the transfer coefficient $$T_{nm}(\omega)=A_{nm}(\omega)e^{-j\omega\tau_{nm}},$$

where $\tau_{nm}$ represents the delay between microphone m and loudspeaker n and $A_{nm}(\omega)$ represents the frequency dependent amplification (or attenuation) between microphone m and loudspeaker n.

A number of well-known electro-acoustical systems will now be considered in the light of the above general matrix notation:

1. In a so-called 'public address' (PA) system the microphones are located close to the sound source and they largely pick up the direct sound. The delays are generally zero. For a simple single channel PA system $M=N=1$, $\tau_{11}=0$ and $A_{11}(\omega)$ equals the desired frequency dependent amplification, $$P_1=A_{11}(\omega)S_1.$$

A more advanced PA system with a mixing console and e.g. six microphones and two loudspeakers, can be represented by $$\begin{bmatrix} P_1 \\ P_2 \end{bmatrix} = \begin{bmatrix} A_{11} & A_{12} & \cdots & A_{16} \\ A_{11} & A_{12} & \cdots & A_{16} \end{bmatrix} \begin{bmatrix} S_1 \\ S_2 \\ \cdot \\ \cdot \\ \cdot \\ S_6 \end{bmatrix}$$

2. In reveberation enhancement systems, such as the well-known MCR system of Phillips, the microphones largely pick up the reverberant sound field, which means that $S_1, S_2 \ldots S_M$ principally define reverberant sound signals (vide Fransen, N. V.; Sur amplification des champs Acoustiques, Acoustica vol. 18, pp 315-223 (1968)). Moreover, the transfer coefficients are delay-free and $\tau_{nm}(\omega)=A_{nm}(\omega)$ represents the frequency dependent channel amplification between microphone m and loudspeaker n. Microphones and loudspeakers that are located close to another must have very small (or zero) amplification to avoid colouration or even howl-back. An optimum choice of all $A_{nm}(\omega)$ values, such that enough reverberant energy is generated on the one hand and colouration is avoided on the other hand, is difficult and requires many channels.

3. In reflection generation systems, such as the system disclosed in EP 0075615, the response can be described by the above matrix relation, with a diagonal matrix $$\begin{bmatrix} P_1 \\ P_2 \\ \cdot \\ \cdot \\ \cdot \\ P_N \end{bmatrix} = \begin{bmatrix} T_{11} & 0 & \cdots & 0 \\ 0 & T_{22} & \cdots & 0 \\ \cdot & \cdot & & \cdot \\ \cdot & \cdot & & \cdot \\ \cdot & \cdot & \ddots & \cdot \\ 0 & 0 & & T_{NN} \end{bmatrix} \begin{bmatrix} S_1 \\ S_2 \\ \cdot \\ \cdot \\ \cdot \\ S_N \end{bmatrix}$$

where amplitude $A_{mn}$ and delay $\tau_{mn}$ simulate a reflection, having the desired amplitude and travel time and coming from the direction of loudspeaker position n.

As a special example, very early reflections may be generated to support the direct sound, such as applied in so-called "Delta-stereofonie" (vide W. Ahnert: The Complex Simulation of Acoustical Sound Fields by the Delta Stereophony System (DSS), 81st Convention of the Audio Engineering Society, J. Audio Eng. Soc. (Abstracts), vol. 34, p. 1035, December 1986). In this system the delay $\tau_{nm}$ is selected such, that the sound of loudspeaker n reaches the listener not earlier, and not later either than a few dozens of ms after the natural direct sound.

Reflection generating systems add to each direct sound microphone signal a desired reflection by selecting the amplitudes and delays of the matrix elements according to the ray paths.

These systems are thus based on ray theory, which means that the desired reflection sequence can be optimally designed only for one specific source and receiving position. As a result of this the solutions embodied in these systems apply, in principle, for a small listening area only. Moreover, if the source position changes, the coefficient $\tau_{nm}$ has to be adjusted (n=1, 2 . . . N).

SUMMARY OF THE INVENTION

The invention aims at improving the above well-known methods such that optimum acoustical conditions are obtained for any source position on the stage and any listener position in any given listening room.

According to the invention this aim is achieved in that the microphone array is arranged to pick up the wave field of the direct sound originating from all of the sources on the stage, the elements of the matrix T being selected according to the Green's function in the Kirchhoff-integral $$T_{nm}(\omega) = \frac{-jk}{2} \cos\phi \, H_1^{(2)} (kr_{nm})$$

for two dimensions, and where $H_1^{(2)}$ represents the first-order Hankel function of the second kind, $$T_{nm}(\omega) = \frac{1}{2\pi} \quad \frac{1 + jkr_{nm}}{r_{nm}} \cos\phi_{nm} \frac{e^{-jkrmn}}{r_{nm}}$$

for three dimensions, where the cosine terms are defined at page 233, line 7, of my book *Applied Seismic Wave Theory*, copyright 1987, Elsevier Science Publishing Company, Inc., New York, and where $r_{nm}$=the distance between microphone m and loudspeaker n, after which processing the loudspeaker array will, with a correct loudspeaker spacing, generate a wave field, that approaches a natural sound field in an acoustically ideal hall.

In a similar way, according to a further characteristic of the invention, sound wave fields which are (additionally) based on (very) early end/or late reflections (reverberant sound) may be simulated by (additionally) processing the picked up direct sound signals according to the matrix relation $$\vec{P} = \Sigma_{ijk} T_{ijk} \vec{S}_{ijk}$$

where $\vec{S}_{ijk}$ represent the image sources in the acoustically desired image hall (i, j, k) and $T_{ijk}$ represent the Kirchhoff-based transfer matrix of the image sources in the image hall (i, j, k) to the loudspeakers in the real listening room and where for the image sources $\vec{S}_{ijk}=(1-\alpha_{ijk})\ \vec{S}$ applies, where $\alpha_{ijk}$ represents the total absorption after (i+j+k) reflections.

It will be understood that for simulating the direct sound field, the real position of each microphone has to be taken into consideration, while for simulating of reflected wave fields the mirror images of the microphone positions in the acoustically desired hall have to be considered.

The measures proposed by the present invention involve the application of the principle of the acoustical holography or wave field extrapolation, described in chapters VIII and X of the book "Applied Seismic Wave Theory" by A. J. Berkhout, Edition Elsevier, 1987.

Wave field extrapolation has brought substantial progress in the field of exploration seismics. This progress has been possible also thanks the application of holographic techniques, whereby seismic wave fields, measured by seismometers on the earth surface, are extrapolated according to geologic structures on great depth. The invention is thus based on the surprising insight that the above principle may be advantageously transferred to the field of electro-acoustics.

The application of the holographic principle implies an approach of the above sound transfer problem according to the wave theory, in contrast with the approach according to the ray theory in e.g. EP 0075615, in which only a marginal improved sound reproduction in a small portion of the total listening area is achieved.

The invention also relates to an electro-acoustical system comprising means for carrying out the method above described.

In order to combat the influence of sound sources, such as fans, use may be made of noise-suppressing filters for the attenuation of acoustical noise.

The electro-acoustical system according to the invention permits the acoustical conditions in multi-functional halls to be adjusted in a flexible manner in accordance with the specific use, while as much freedom as possible is left to the architect. The system according to the invention enlarges the possibilities for both the architect and the acoustician. The acoustician determines the pattern of the reflections of the order zero, one and higher, which would exist in a fictive hall and which would be ideal for a certain use. These desired, natural, spatial reflection patterns are generated by a configuration of microphones and loudspeakers in the existing room. By means of the system according to the invention, the unique situation is created that in the existing hall designed by the architect, that acoustic condition can be realised which fits with a fictive ideal hall in accordance with the choice of the acoustician. By changing the acoustical parameters, such as volume, volume, form and absorption of the fictive hall, the acoustic condition in the existing room changes in a very natural manner.

Due to the fact that the system according to the invention is not based on acoustical feedback, the reverberation time may be substantially lengthened without the danger of colouring, whereas the reverberation level may be changed independent of the reverberation time—even such that both 'single-decay' and 'double-decay' curves may be achieved. Moreover, lateral reflections may be extra emphasized and the direct field may be substantially amplified in a very natural manner, i.e. without localisation errors.

When applying the system according to the invention acoustical feedback will be kept to a minimum in that:

1. Largely direct sound is picked up; the microphones are positioned principally on and around the source area, as e.g. the stage; acoustical feedback can be further reduced by:
2. the use of directional microphones;
3. the use of directional loudspeakers-in particularly directed to the audience;
4. making the components of the processor time-variable.

Furthermore the acoustical noise may be reduced by:

1. positioning one or more microphones adjacent the acoustical noise sources;
2. supplying the microphone signals to the loudspeakers via a multichannel-anti-noise filter and
3. selecting the filter coefficients of the anti-noise filter such that the acoustical noise is compensated at the loudspeakers.

A major advantage of the system according to the invention is to be seen in that fine-tuning from the real room is possible, as a result of which each desired sound field may be almost completely achieved.

The electro-acoustical system according to the present invention may be realised in eight steps:

1. analysis of the acoustical conditions in the real room;
2. specification of the desired acoustical conditions—in case of a multi-functional hall also the desired variations relative to a reference-acoustical condition;
3. determination of the number and positions of the microphones and loudspeakers;
4. building and pre-programming of the system;
5. installation of the system;
6. fading in of the system, so that the desired referential acoustical condition will be realised ("calibration");
7. varying the system parameters, so that, starting from the referential acoustics, a number of preferred presettings may be obtained in accordance with the various purposes ("from reference to preference") and
8. storing of the preferred presettings in the memory of the processor, from which such presettings may be called by means of a keyboard.

With the system according to the invention the following system-parameters may be varied for the realisation of the preferred presettings:

1. the reverberation times in frequency bands with central frequencies in the audio region;
2. the sound pressure levels in those frequency bands;
3. the scale factor of the total reverberation characteristic;
4. the input-amplification of all the microphones; and
5. the output amplification of all of the loudspeakers.

Each parameter may be varied in steps. The advantage of the above measures is to be seen in that the fading in of the system may be effected in a quick and simple manner and that each objective and subjective demand can be met.

The system according to the invention may be composed of three parts:

1. the pick up sub-system, comprising the microphones with noise-suppressing pre-amplifiers and equalizers;
2. the central processor comprising the reflection-simulating units and
3. the reproduction sub-system, comprising the loudspeakers with distortion-free final amplifiers.

The central processor embodies the transfer matrix T and forms the heart of the electro-acoustical system.

In the central processor each reflection simulating unit is taking care of a weighted and delayed signal between each microphone and each loudspeaker. The various reflection simulating units are internally coupled. The required number of units depends on the size and the form of the room and the required maximum reverberation time.

The system according to the invention may consist of any combination of four independent modules, viz. a hall module, a stage module, a speech module and a theatre module.

The functions of the various modules are as follows:

Hall Module

By means of this module a desired reverberation field may be realised in the hall, tending to maximum "spaciousness". In halls with deep balconies it will often be necessary to use a number of reverberation modules. Early reflections may be additionally amplified or late reflections may be additionally attenuated to improve the 'definition' of music. By means of the system according to the invention it is even possible to have sound decay at two rates, e.g. at first quick and then slow.

Stage Module

By means of this module the early reflections desired on the stage may be realised, thereby creating optimum combined action conditions for the musicians of an ensemble.

Speech Module

This module is speech supporting, use being made of one or more PA-microphones (PA=public address). By means of the speech module the direct sound field (reflections of the order zero) may be reconstructed in any spot of the room in a completely natural manner, i.e. keeping the correct localisation and in each frequency band with any desired level.

Theatre Module

This module is speech supporting by adding early reflections without making use of PA-microphones: the direct sound is picked up by a number of microphones over and/or in front of the stage. Reconstruction is taking place as with the speech module.

BRIEF FIGURE DESCRIPTION

The invention will be hereinafter further explained with reference to the accompanying drawings.

FIG. 1 shows in a caricatural manner the different lines of approach of the architect of a hall and of the acoustician;

FIG. 2 illustrates the principle of the system according to the invention, only one microphone-loudspeaker pair being shown;

DETAILED DESCRIPTION

Figure 3:
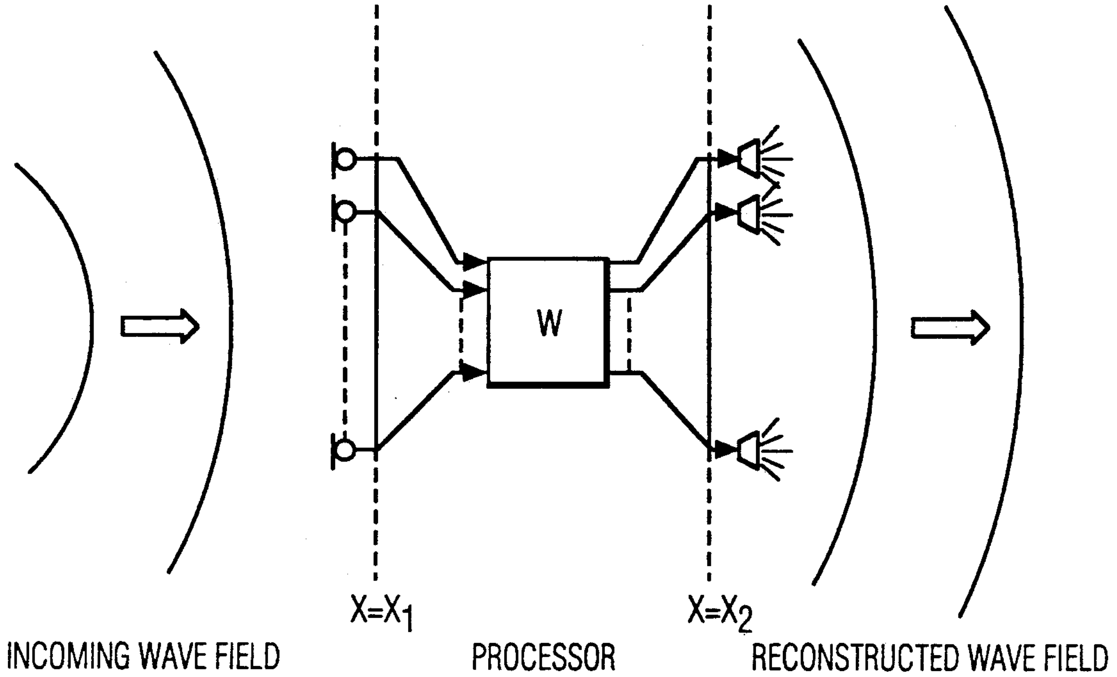
FIG. 3 is a diagrammatic view of a sound wave field picked up by an array of microphones, and of a sound wave field reconstructed by means of a processor and an array of loudspeakers.

FIG. 1 illustrates in a simple manner how the architect 1 comes to a certain shape of the room or hall 2. The acoustician 3 comes, from his point of view, to a totally different hall shape 4, which is based on acoustical principles. In practice an optimal cooperation between the architect 1 and the acoustician 3 will result in a acoustical compromise at the most.

In FIG. 2 the principle of the present invention has been shown for one microphone-loudspeaker pair. In the real architectonic room or hall 5 the source field is picked up on the stage 6 and transmitted to an impulsive source 13 in a fictive (hypothetical) acoustically ideal hall, which is defined in the processor 15 (FIG. 3).

In the 'ideal hall' the sound is reverberated. Thereupon the reverberation sound field is picked up by receivers, such as receiver 8 and transmitted to corresponding locations 9 in the real architectonic room 5 by means of loudspeakers, such as loudspeaker 9. Source 13 in the desired hall 7 has the same position as the microphone 6 in the real room 5. The receiver 8 in the desired hall 7 has the same position as the loudspeaker 9 in the real hall 5. In this way an acoustically ideal hall may be 'constructed' within the architectonic hall. The acoustical system according to the present invention can be considered to work with two halls: the real hall and a fictive (hypothetical) one.

Said one microphone-loudspeaker pair in FIG. 2 only serves to illustrate the transfer action or—processing, which is taking place between a microphone and a loudspeaker via reproduction—and pick up components in the fictive hall. In reality the type of transfer aimed at by the invention requires a dense network of microphones and loudspeakers, so that a wave field may be created both on the input and the output side. It has been found that by means of linear arrays of loudspeakers at the side walls and ceilings with a mutual spacing of about 2 meters, very good results may be obtained.

In this connection reference is made to FIG. 3, which illustrates how the sound pressure of a propagating wave field is 'measured' by an array of microphones, positioned in plane $x=x_1$. In the generalised version of acoustical holography, the measured microphone signals are supplied to a processor which causes the propagation (extrapolation) to an other plane, e.g. $x=x_2$ to take place in a numerical way. With reference to FIG. 3 it will be easily understood that the 'measuring result' in plane $x=x_1$ may be—as an intermediary step—stored on e.g. an M-track recording tape or similar storage member, which may be played via the processor on any desired moment.

Figure 4:
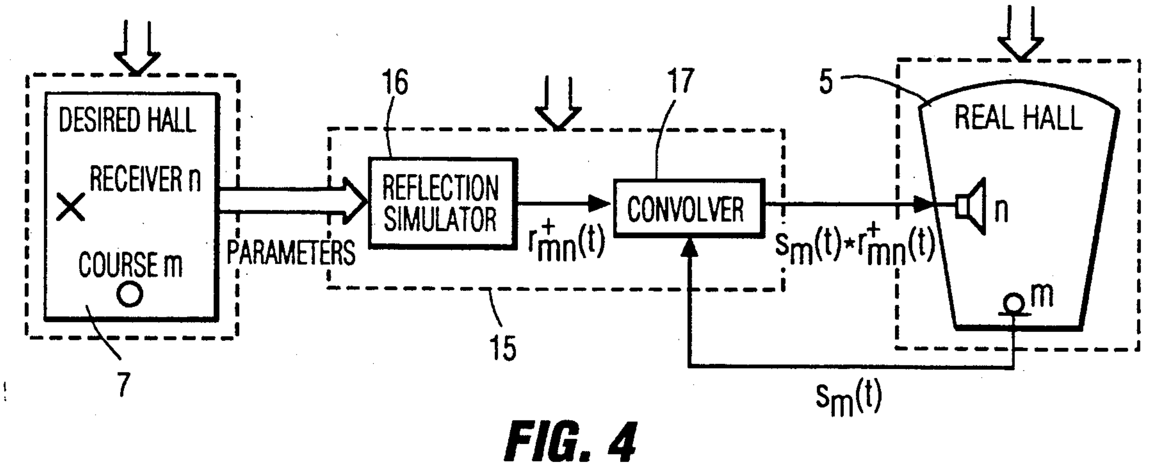
FIG. 4 shows a block diagram of the system according to FIG. 2.

FIG. 4 illustrates the system according to the invention in block diagram for one microphone-loudspeaker pair. It is to be remarked that the processor 15 may operate either in the analog or in the digital mode. The processor 15 comprises a reflection-simulator 16 and a convolver 17 for the convolution processing. If $r_{mn}$ (t) represents the impulse response at receiver position n due to impulsive source m, the superscript + indicating that only waves leaving the wall are considered, then the desired reflection patterns at wall position n of the real hall is given by the convolution $P_{mn}(t)=S_m(t) * r_{mn}(t)$, wherein $S_m$ (t) represents the microphone signal of the direct sound in position m. In the ral hall 5 a portion of the response $P_{mn}$, however, will be fed back to microphone m.

If said feedback between loudspeaker n and microphone m are not to be neglected the convolution $S_m(t) * r_{mn}(t)$ has to be substituted by $S_m(t) * r'_{mn}(t)$ where in the frequency domain ($\omega$)

$$R'_{mn}(\omega) = \frac{R_{mn}(\omega)}{1 + G_{nm}(\omega)\, R_{mn}(\omega)}$$

is and $G_{nm}(\omega)$ defines the transfer function relating to the feedback between loudspeaker n and microphone m in the real hall.

Note the fundamental difference between $R_{mn}(\omega)$ and $G(\omega)$:

$R_{mn}(\omega)$ is a simulated transfer function in the desired hall;

$G_{nm}(\omega)$ is a measured transfer function in the real hall.

In the system according to the invention the feedback phenomenon (quantified by $G_{nm}$) may be minimized, viz. to $|G_{nm}(\omega) R_{mn}(\omega)| << 1$ for all m and n by taking the following measures:

1) The loudspeakers direct their energy to the absorbtive area as much as possible.
2) The microphones have maximum sensitivity in the direction of the source area and no sensitivity in the opposite direction ($G_{nm} \rightarrow G_{nm}^{+}$).
3) The microphones are mounted near the source area where the direct sound level dominates the reverberant sound level.
4) The parameters of the desired impulse response $R_{mn}(\omega)$ are made time variable.

Hence in the system according to the invention $R'_{mn}(\omega) \approx R_{mn}(\omega)$ is aimed at.

In case of a noise source being present in the real hall, a compensation circuit comprising an noise-suppressing filter may be additionally applied according to $$F_{ln}(\omega) = -G_{ln}(\omega) - G_{lm}(\omega) R'_{mn}(\omega)$$

where l indicates the microphone position adjacent the noise source, such as a fan opening.

Figure 5:
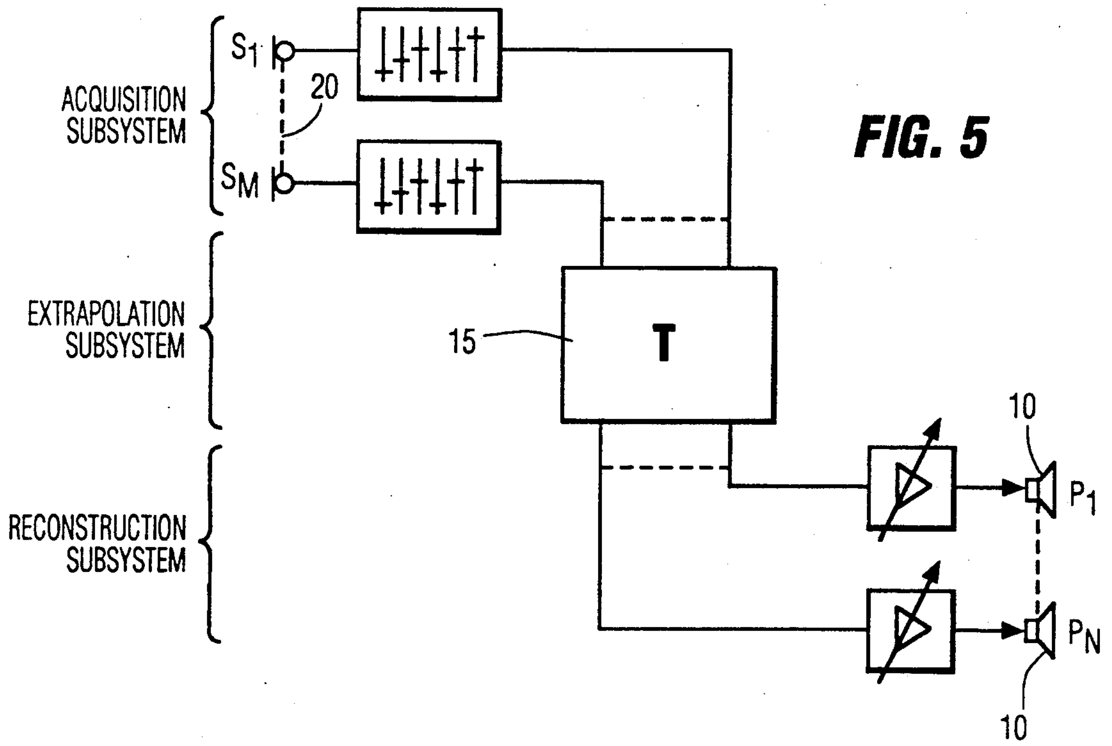
FIG. 5 illustrates the composition of the parts of the system according to the invention.

In FIG. 5 the data flow has been shown in diagrammatic form. In the system according to the present invention the source wave field is picked up by a network of microphones 20. Thereupon the desired reflection pattern—belonging to the fictive hall 7—is simulated by the central processor T. Said reflection pattern is then transmitted to the real hall 5 by means of a network of loudspeakers 10. In FIG. 5 (as well as in FIG. 7) three stages are to be distinguished:

I. Acquisition
II. Extrapolation
III. Reconstruction.

which stages are embodied in as many sub-systems.

I. The acquisition sub-system measures the direct sound field with an array of high quality broadband microphones adjacent the stage. The microphone signals are amplified, optionally equalized and supplied to the extrapolation sub-system.

II. The extrapolation sub-system consists of a number of reflection simulating units. Depending on the maximum $T_{60}$ required and the size of the hall, many reflection simulating units may be needed to include the necessary high-order reflections in $R_{mn}$ (t).

III. The reconstruction sub-system transmits the simulating reflections back into the hall by means of an array of high quality broad-band loudspeakers, distributed along the surfaces of the entire hall. It should be noted that at a given position in the hall the reflection tail is not made by just one loudspeaker, but is synthesized by contributions of all of the loudspeakers: holography is principally multi-channel.

Figure 6:
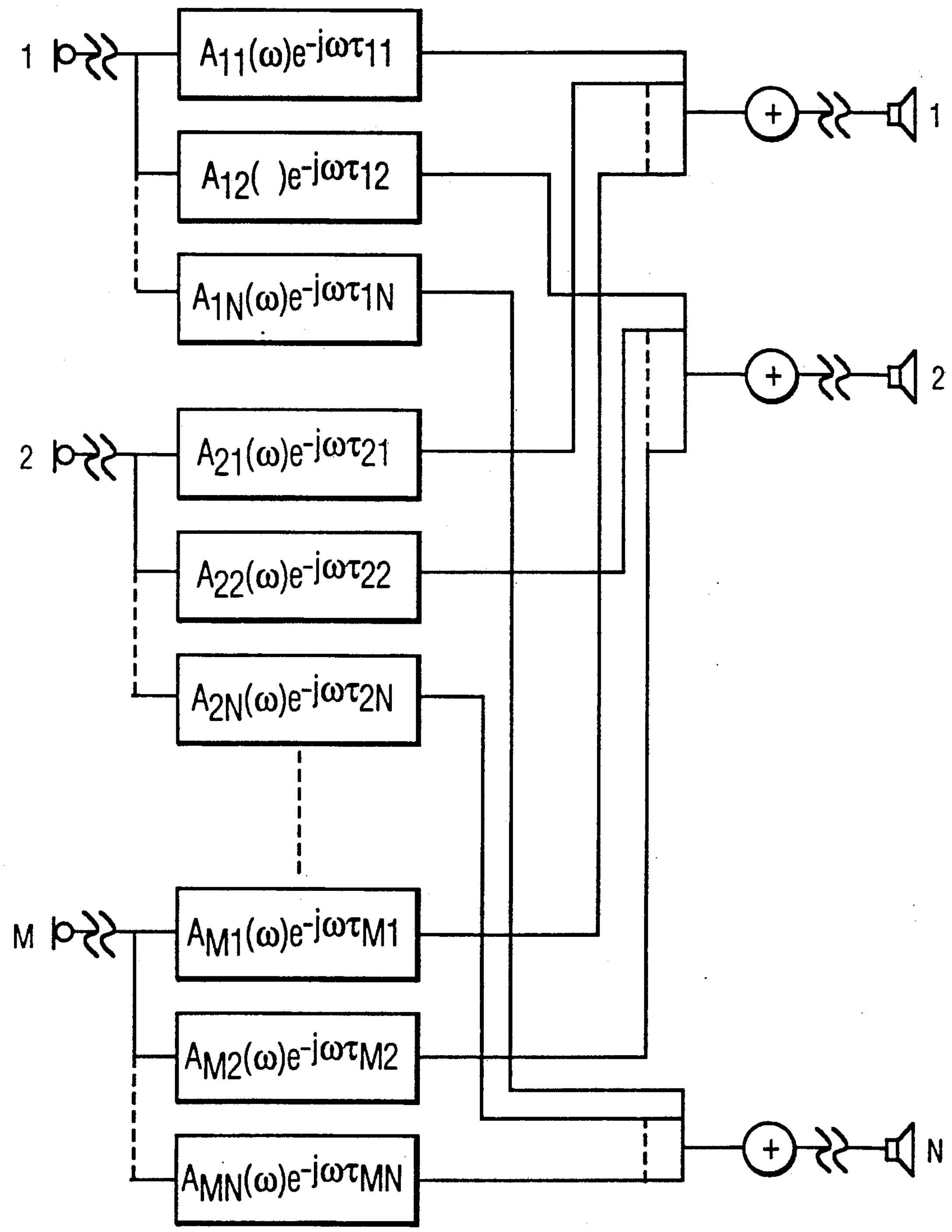
FIG. 6 shows in diagrammatic form the composition of a reflection simulating unit according to the invention.

FIG. 6 shows a diagrammatic configuration of a reflection-simulating unit 16 (order zero for speech, first and higher order for reverberation). The coefficients are determined in the manner indicated above.

Figure 7:
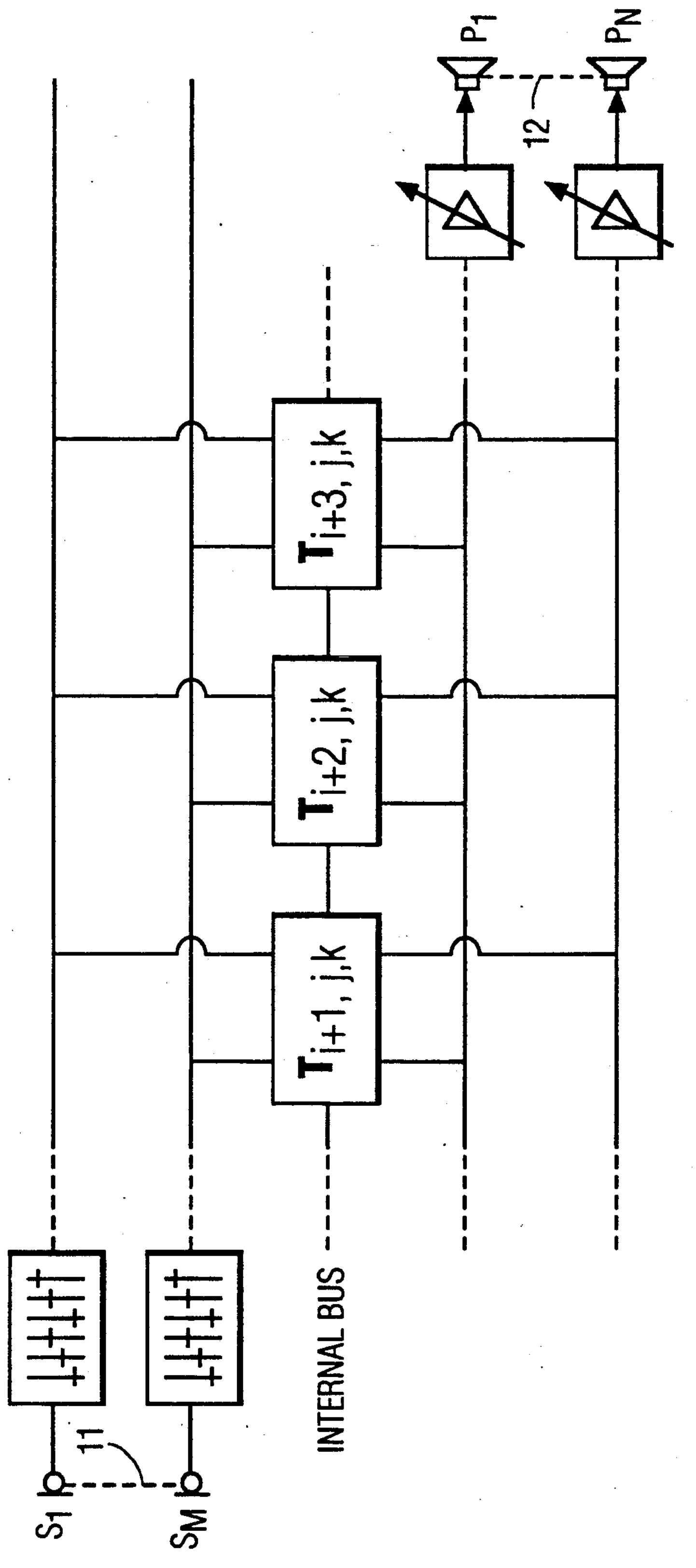
FIG. 7 shows the central processor of the system according to the invention.
Figure 9:
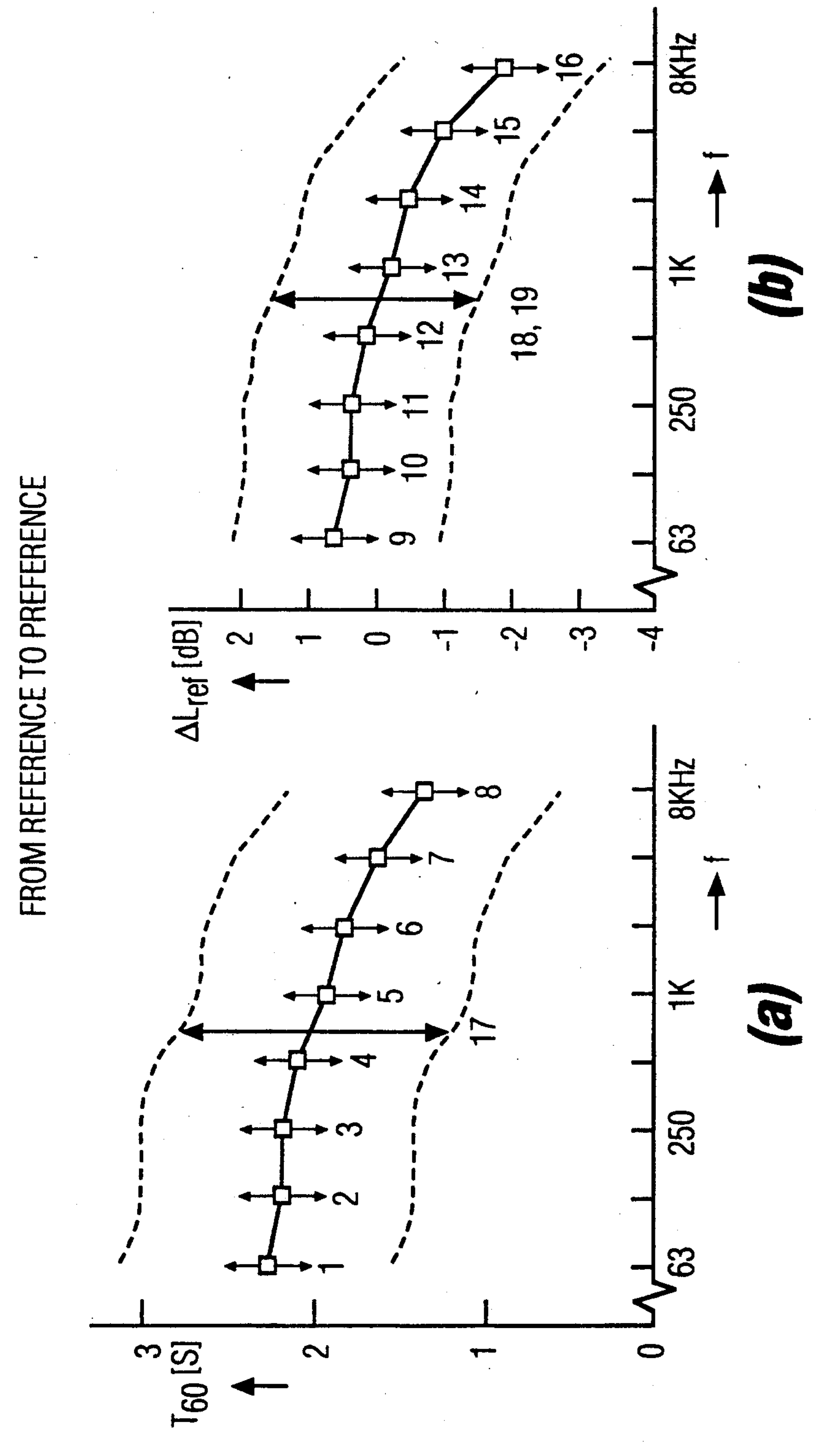
FIG. 9 illustrates the effect of the change of a number of system parameters for the fine-tuning.

In FIG. 7 a diagrammatic arrangement of the electro-acoustical system of the invention is shown. The central processor T comprises a number of reflection simulating units 16. Each reflection simulating unit is determined by the transfer function between M sources 11 and N loudspeakers 12 for a certain order of reflection.

If the M input signals of the extrapolation sub-system in FIG. 5 or 7 are represented by input factor $\vec{S}$ ("source") and the M output signals are indicated by output factor $\vec{P}$ ("pressure"), the relation between input and output may be represented by a transfer matrix T ("transfer") as follows:

$$\vec{P}=T\vec{S}$$

In the system the transfer matrix T is designed per octave band and is thus composed of a number of sub-matrices:

$$T_{ijk}$$

where i is the number of reflections against the side walls;
j is the number of reflections against front and back walls and
k is the number of reflections against ceiling and floor.

The source factor $\vec{S}$ is composed of a number of sub-factors $\vec{S}_{ijk}$.

Figure 8:
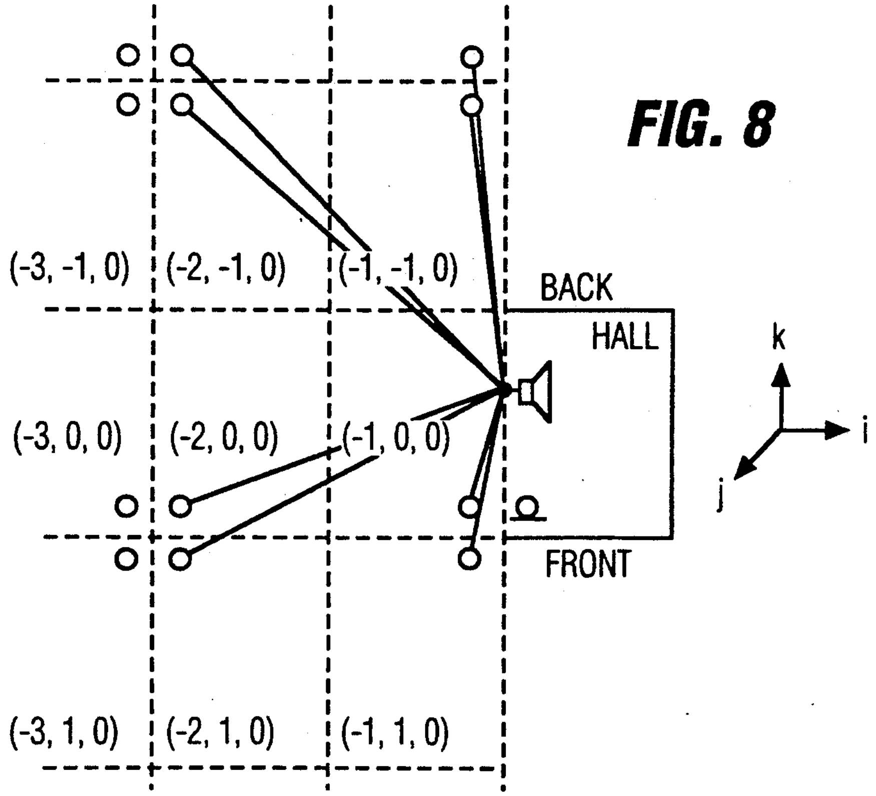
FIG. 8 illustrates a simulation by means of image sources.

FIG. 8 illustrates the simulation of the desired reverberation field, by using the image source approach. Each simulating unit represent the transfer function between the sources in one image version of the fictive hall and the loudspeakers in the real hall.

$T_{ijk}$ thus represents the transfer function between the M sources in the fictive (i, j, k) and the relevant loudspeakers in the real hall. If the floor is considered to be fully absorptive then k=0 or 1. If the back wall is considered to be fully absorptive, then j=0 or 1. For direct sound control i=0, j=0 and k=0. (FIG. 6).

After the system according to the invention has been installed, the fine-tuning procedure may start. The principle of it is as follows: at first a reference setting is determined by carrying out interactive measurements such that $T_{60}$ values and sound pressure levels meet the specifications. The reference setting could be selected such that, when the system is switched on, the reverberation time values in octave bands measured in the hall correspond to those in the Amsterdam Concertgebouw, with reverberant sound pressure levels related to the reverberation times according to physical laws. As mentioned before, appropriate ratios of early-to-late and lateral-to-frontal energy could be aimed at.

Starting from the reference setting which is stored in the memory of the processor of the system, preference settings can be adjusted to 'instantaneous multi-purpose requirements' or 'subjective alternatives' by varying 19 fine-tuning parameters:

1–8: the individual reverberation time values in the 8 octave bands from 63 Hz up to 8 kHz;
9–16: the individual pressure levels in the same octave bands;
17: the scaling factor for all reverberation times;
18: the input amplification of all microphones:
19: the output amplification of all loudspeakers.

Figure 10:
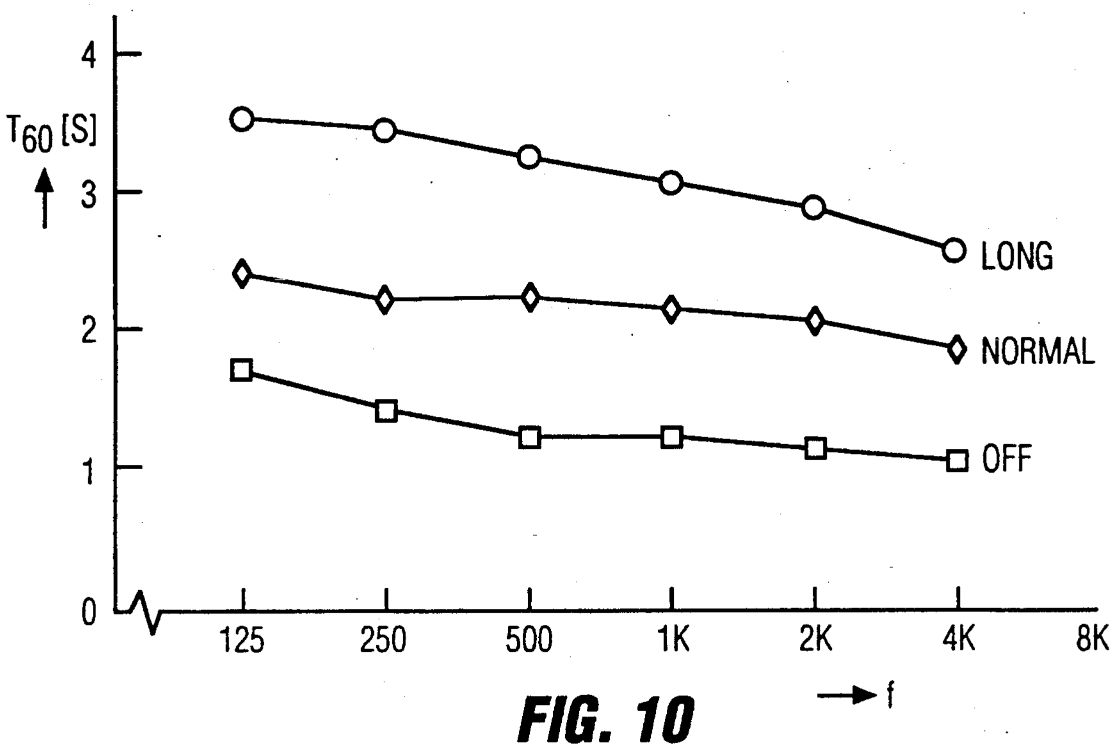
FIG. 10 shows a few reverberation times of the auditorium of the Delft University.
Figure 11:
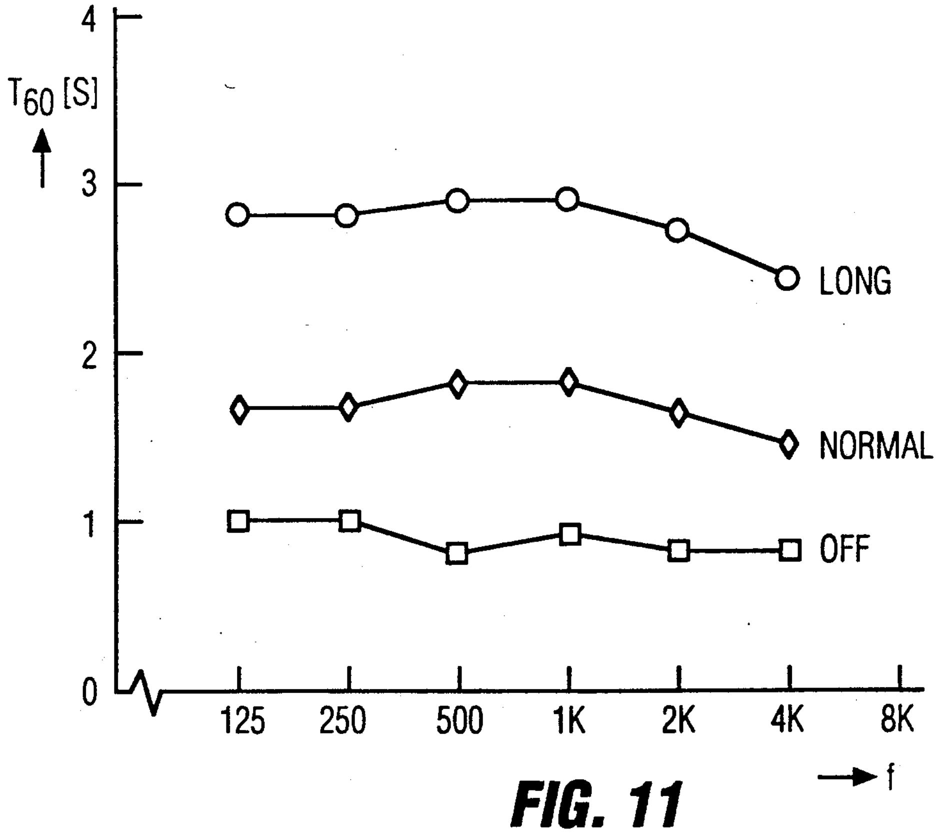
FIG. 11 illustrates a few reverberation times of the York University, Toronto.

In FIG. 10 and 11 a few reverberation times are indicated, which apply for the auditorium of delft University and for the auditoruim of York University (Toronto) respectively, without and with the system according to the present invention.

Figure 12:
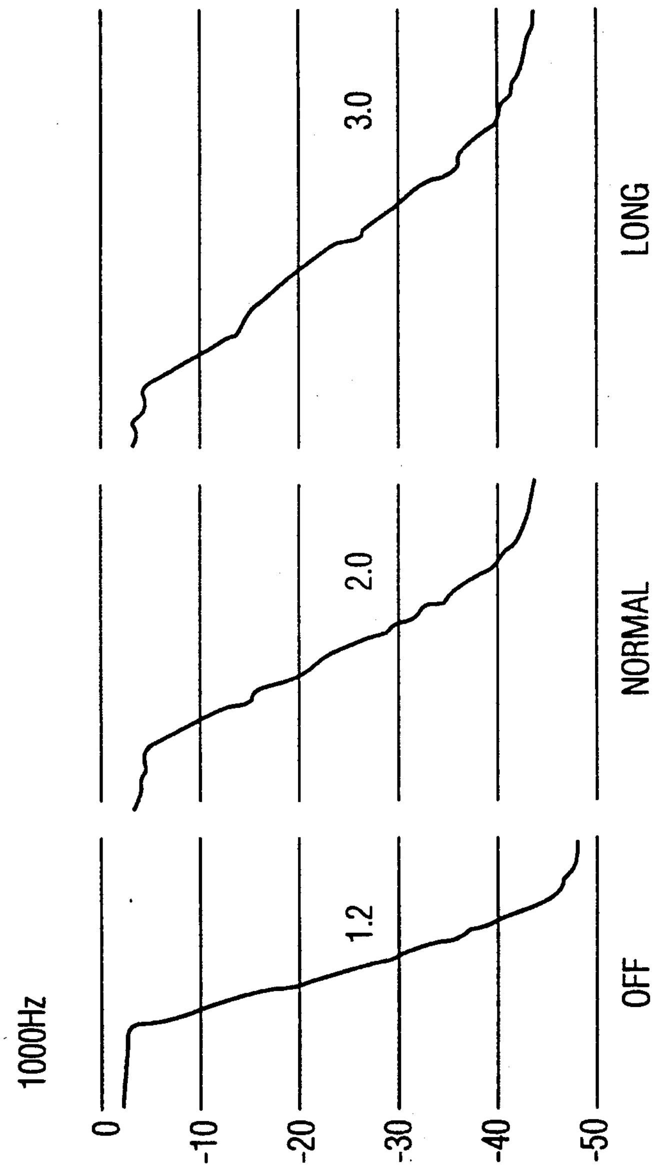
FIG. 12 shows a few decay curves of the auditorium of the Delft University.
Figure 13:
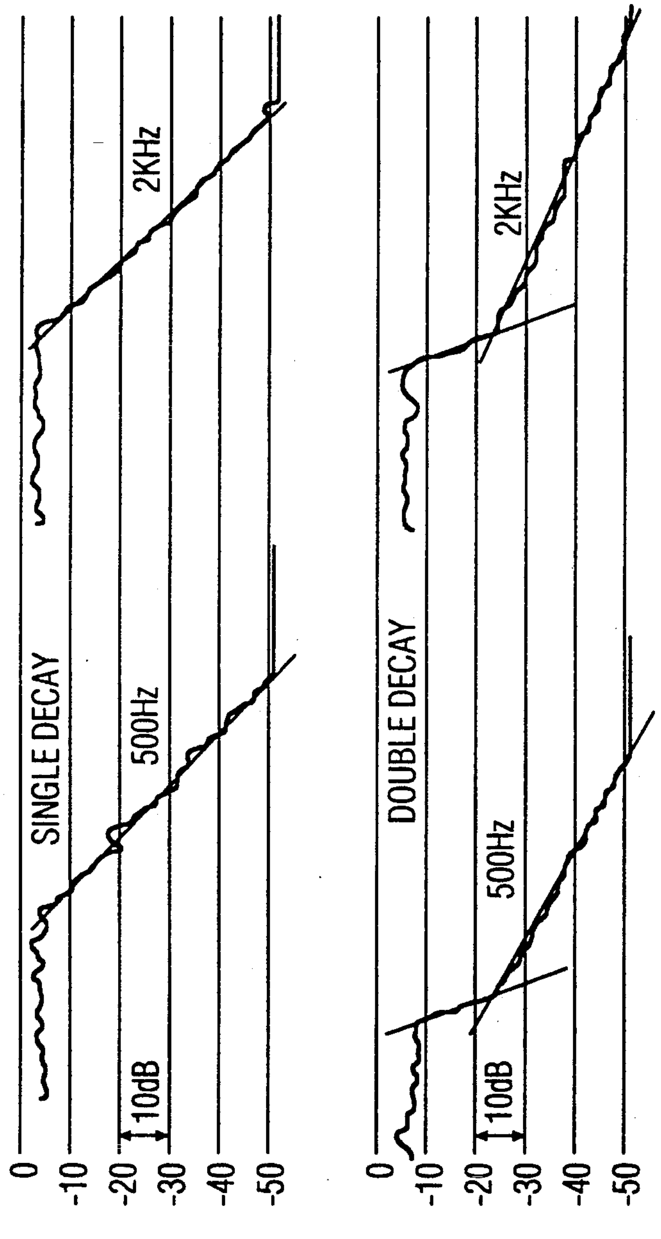
FIG. 13 shows a few decay curves of the York University, Toronto.

FIGS. 12 and 13 show a few decay curves, applying for the auditorium of the Delft University ('single decay') and of York University ('double decay') respectively for 500 Hz. It will be appreciated, that very small decay rates may be generated without the slightest tendency to colouring. It has been found that settings with relatively strong early reflections (or relatively weak late-reflections) create an excellent intelligibility, even with reverberation times of as high as 4 s.

I claim:

1. A method for processing the sound emitted by at least one sound sources in a listening room, by recording said sound by means of a number of microphones, the signals (S) of which are processed in a processor according to the matrix relation $\vec{P}=T\,\vec{S}$, in which (P) represents the processed signals supplied from the processor to a number of loudspeakers distributed across the listening room, and wherein T represents the following transfer matrix:

$$T=\begin{pmatrix} T_{11} & T_{12} & \cdots & T_{1M} \\ T_{21} & T_{22} & \cdots & T_{2M} \\ \cdot & \cdot & & \cdot \\ \cdot & \cdot & & \cdot \\ \cdot & \cdot & & \cdot \\ T_{N1} & T_{N2} & \cdots & T_{NM} \end{pmatrix}$$

wherein M and N represent the number of microphone signals and loudspeaker signals respectively, characterized in that the microphone array is arranged to pick up the wave field of the direct sound originating from all of the sources on the stage, the elements of the matrix T being selected according to the Green's function in the Kirchhoff-integral $$T_{nm}(\omega) = \frac{-jk}{2} \cos\phi\, H_1^{(2)} (kr_{nm})$$

for two dimensions, and $$T_{nm}(\omega) = \frac{1}{2\pi} \frac{1 + jkr_{nm}}{r_{nm}} \cos\phi_{nm} \frac{e^{-jkrmn}}{r_{nm}}$$

for three dimensions, where j and k are numbers of reflections, $r_{nm}$=the distance between microphone m and loudspeaker n, after which processing the loudspeaker array will, with a correct loudspeaker spacing, generate a wave field, that approaches a natural sound field in an acoustically ideal hall.

2. A method according to claim 1, characterized in that sound wave fields which are based on reverberant sound may be simulated by processing the picked up direct sound signals according to the matrix relation $$\vec{P} = \Sigma_{ijk} T_{ijk} \vec{S_{ijk}}$$

where $\bar{S}_{ijk}$ represent the image sources in the acoustically desired image hall (i, j, k) and $T_{ijk}$ represent the Kirchhoff-based transfer matrix of the image sources in the image hall (i, j, k) to the loudspeakers in the real listening room and where for the image sources $\bar{S}_{ijk} = (1-\alpha_{ijk})\, \bar{S}$ applies, where $\alpha_{ijk}$ represents the total absorption after (i+j+k) reflections.

3. A method according to claim 1, characterized in that the microphone signals are stored on a recording means prior to being supplied to the processor.

4. Electro-acoustical system for picking up the sound emitted by at least one sound source on a stage in a listening room by means of an array of microphones, which are connected to a processor, the outputs of which are connected to an array of loudspeakers distributed accross the listening room, the processor being designed to create between the microphone signals S and the loudspeaker signals P the transfer matrix relation:

$$T = \begin{pmatrix} T_{11} & T_{12} & \cdots & T_{1M} \\ T_{21} & T_{22} & \cdots & T_{2M} \\ \vdots & \vdots & & \vdots \\ T_{N1} & T_{N2} & \cdots & T_{NM} \end{pmatrix}$$

wherein M and N represent the number of microphone signals and loudspeaker signals respectively, characterized in that the microphone array is arranged to pick up the wave field of the direct sound originating from all of the sources on the stage, the elements of the matrix T being selected according to the Green's function in the Kirchhoff-integral $$T_{nm}(\omega) = \frac{-jk}{2\pi} \cos\phi\, H_1^{(2)} (kr_{nm})$$

for two dimensions, and $$T_{nm}(\omega) = \frac{1}{2\pi} \frac{1 + jkr_{nm}}{r_{nm}} \cos\phi_{nm} \frac{e^{-jkrmn}}{r_{nm}},$$

for three dimensions, where j and k are numbers of reflections, $r_{nm}$=the distance between microphone m and loudspeaker n, after which processing the loudspeaker array will, with a loudspeaker spacing sealed to hall size, generate a wave field, that approaches a natural sound field in an acoustically ideal hall.

5. Electro-acoustical system according to claim 4, characterized in that the processor is also designed to process the direct sound picked up by the microphones according to the matrix relation $$\vec{P} = \Sigma_{ijk} T_{ijk} \vec{S_{ijk}}$$

where $\bar{S}_{ijk}$ represent the image sources in the acoustically desired image hall (i, j, k) and $T_{ijk}$ represent the Kirchhoff-based transfer matrix of the image sources in the image hall (i, j, k) to the loudspeakers in the real listening room and where for the image sources $\bar{S}_{ijk} = (1-\alpha_{ijk})\, \bar{S}$ applies, where $\alpha_{ijk}$ represents the total absorption after (i+j+k) reflections.

6. Electro-acoustical system according to claim 4, characterized in that the processor is designed to modify the transfer function $R_{mn}(\omega)$ between microphone m and loudspeaker n according to $$R'_{mn}(\omega) = \frac{R_{mn}(\omega)}{1 + G_{nm}(\omega) R_{mn}(\omega)}$$

where $G_{nm}(\omega)$ represent the transfer function of the real hall between loudspeaker n and microphone m.

7. Electro-acoustical system according to claim 4, characterized by a compensation circuit with an anti-noise filter satisfying the relation $$F_{ln}(\omega) = -G_{ln}(\omega) - \sum_{m=1}^{M} G_{lm}(\omega) R'_{mn}(\omega),$$

where l represents the microphone position adjacent an acoustical noise source, if any, G is a feedback transfer-function and $F_{ln}(\omega)$ represents the desired transfer function of the anti-noise filter between microphone l and loudspeaker n, said compensation circuit being adapted to be selectively switched on.

* * * * *